United States Patent [19]

Kennedy et al.

[11] Patent Number: 4,987,387

[45] Date of Patent: Jan. 22, 1991

[54] PHASE LOCKED LOOP CIRCUIT WITH DIGITAL CONTROL

[75] Inventors: Richard A. Kennedy, Kokomo, Ind.; Seyed R. Zarabadi, Columbus, Ohio; Stephen L. Inman; Martin G. Gravenstein, both of Kokomo, Ind.

[73] Assignee: Delco Electronics Corporation, Kokomo, Ind.

[21] Appl. No.: 404,793

[22] Filed: Sep. 8, 1989

[51] Int. Cl.⁵ .................. H03L 7/093; H03L 7/183
[52] U.S. Cl. .................... 331/1 A; 331/14; 331/17; 331/25
[58] Field of Search ............. 331/1 A, 14, 17, 25

[56] References Cited

U.S. PATENT DOCUMENTS 4,523,150  6/1985  Hogeboom ............... 331/14 X
4,636,748  1/1987  Latham, II ............... 331/17
4,649,353  3/1987  Sonnenberg ............. 331/8

*Primary Examiner*—Siegfried H. Grimm
*Attorney, Agent, or Firm*—Albert F. Duke

[57] ABSTRACT

A Phase Locked Loop (PLL) circuit includes a control signal generator, a digital phase detector, logic gates, a charge pump (charge/discharge circuit), a transmission gate, a loop filter, a lead-lag filter and a voltage controlled oscillator (VCO). Outputs of the digital phase detector are coupled through the logic gates to inputs of the charge pump. An output of the charge pump is coupled to the capacitor and to a first input/output of the transmission gate. A second input/output of the transmission gate is coupled to an input of the loop filter whose output is coupled to an input of the VCO whose output is coupled to a first input of the digital phase detector. A second input of the digital phase detector is coupled to a source of a reference frequency signal. The control signal generator generates non-overlapping complementary control signals with one of same connected to the logic gates and the other connected to the transmission gate. Accordingly, the electrical path from the digital phase detector to the charge pump through the logic gates is closed and the electrical path from the capacitor to the loop filter is open or vice versa. The loop filter includes an operational amplifier with AC feedback which is controlled by the same signal which controls the logic gates. The PLL circuit is typically formed on a single integrated circuit silicon chip using CMOS technology.

21 Claims, 4 Drawing Sheets

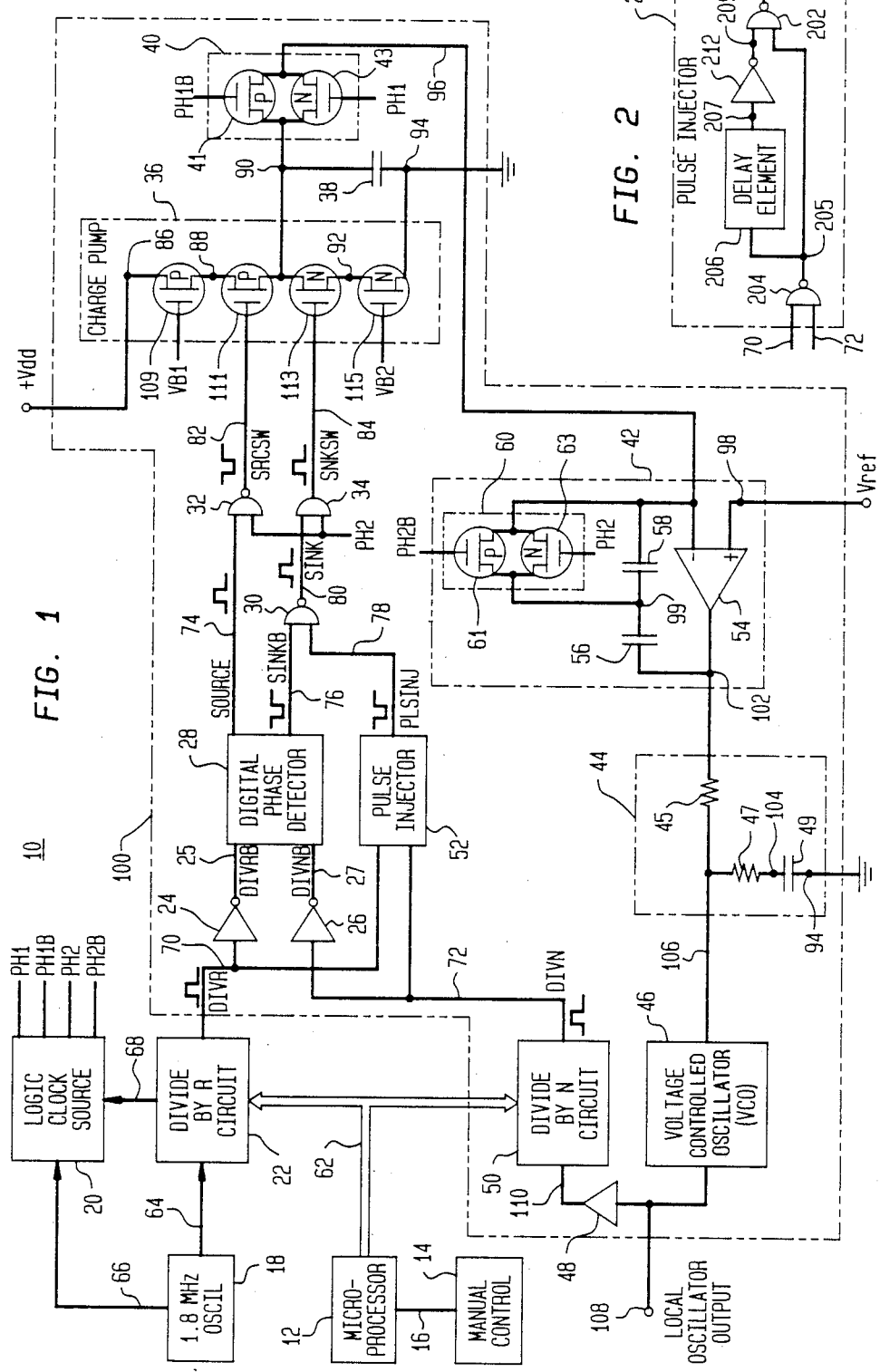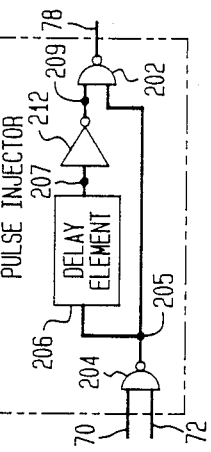

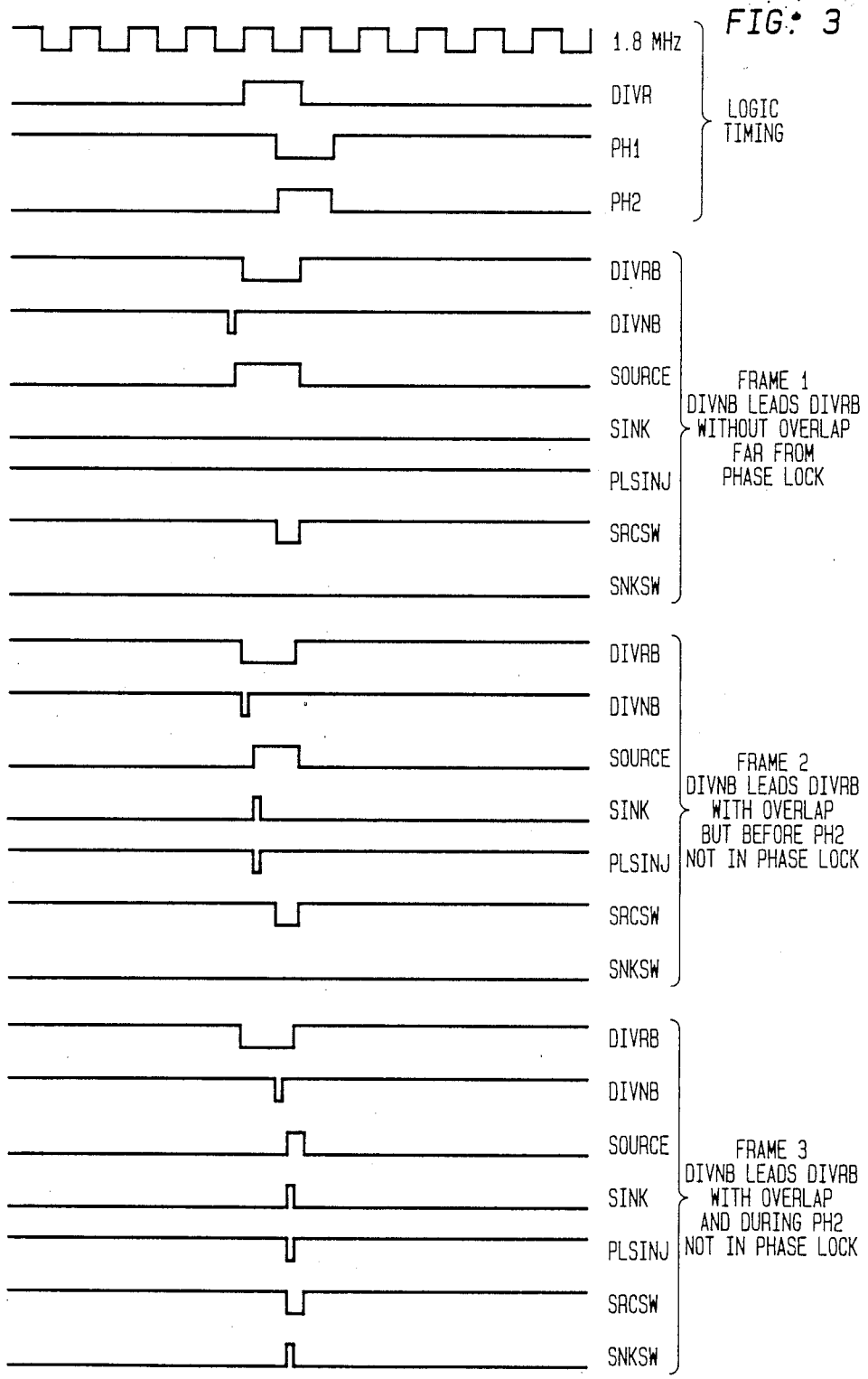

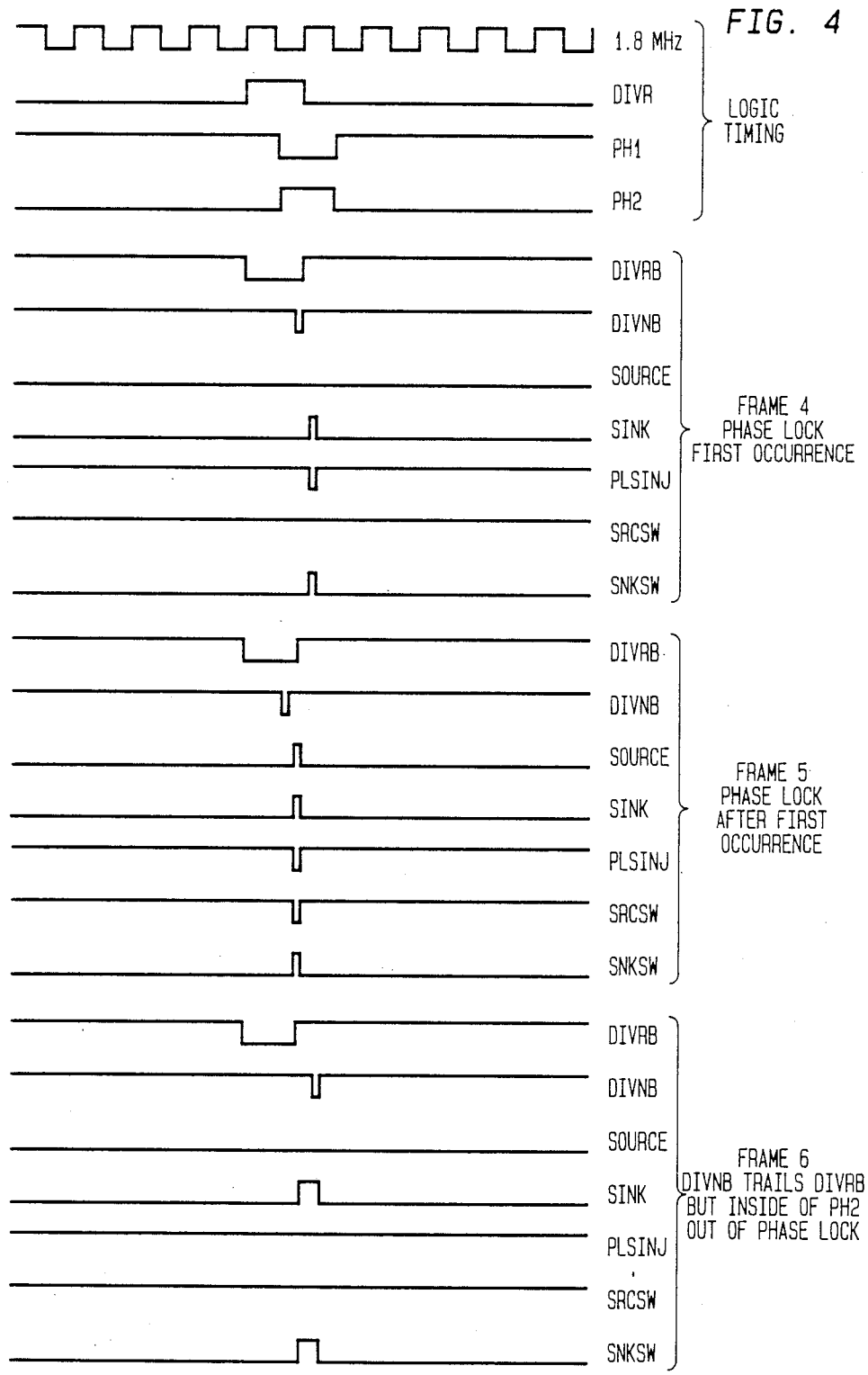

PHASE LOCKED LOOP CIRCUIT WITH DIGITAL CONTROL

FIELD OF THE INVENTION

This invention relates to tunable Phase Locked Loop (PLL) circuits.

BACKGROUND OF THE INVENTION

Phase Locked Loop (PLL) circuits are widely used to tune local oscillators in radio receivers. In a tunable phase locked loop circuit, a "divide by N" signal, which is derived from the output of a voltage controlled oscillator (VCO), is brought into phase lock with a reference frequency signal. The PLL circuit includes a phase detector circuit which compares the phase of the reference frequency signal and the "divide by N" signal and generates increase frequency and decrease frequency signals for selectively increasing and decreasing control voltage to the VCO. Although increase frequency and decrease frequency signals are generated at the reference frequency, loop stability considerations typically limit the closed loop bandwidth to a fraction of the reference frequency.

When the PLL circuit is "locked" to the reference frequency and there is little or no phase difference between the "divide by N" signal and the reference frequency signal, the phase detector must detect at least a minimum threshold phase difference before a significant decrease frequency signal or a significant increase frequency signal is generated. A significant signal is a signal of sufficient duration to keep the loop active. In the absence of significant signals, there is an effective "open loop" or "dead band" condition on the loop which allows the VCO to slowly and randomly drift up or down in output frequency. VCO drift in frequency is caused by random noise or leakage paths within the loop which may increase or decrease VCO operating frequency. The relatively slow variations in VCO output frequency, when in the "dead band" condition, adversely affect loop stability and result in unacceptable FM noise modulation of the VCO output signal.

Where the stray leakage paths are sufficient to maintain a static phase error beyond the phase detector threshold, the loop will not enter the dead band condition and correction increase frequency or decrease frequency signals will be generated correctly. In many prior art PLL circuits there are sufficient stray leakage paths to sustain activity on the loop at the reference frequency. If the stray leakage paths are not sufficient to sustain such loop activity, a resistor of high value can be added to provide an explicit leakage path.

In any event, prior art PLL circuits which rely on stray or intentional leakage exhibit undesirable performance. The VCO is subject to continuous phase pulling which is periodically brought back into alignment by the control signal (pulses) from the phase detector. This in turn produces a periodic ripple on the input signal to the VCO. The result is the introduction of side bands on the VCO occurring at multiples of the reference frequency. This condition is typically remedied by reducing the loop bandwidth and introducing additional low pass poles in the loop filter.

One prior art method of improving on the above described limitations of analog leakage is know as pulse injection.

Rather than using an analog leakage path, if the leakage is injected as a pulse, which is normally timed to correspond to the correction pulse from the phase detector, the spectrum generated by the injection pulse and the correction pulse (from the phase detector) essentially cancel each other. This reduces but does not eliminate completely side band noise.

It is desirable to have a phase locked loop circuit which has both predictable loop dynamics and low side band noise.

SUMMARY OF THE INVENTION

The present invention is directed to circuitry which is useful as Phase Locked Loop (PLL) circuits. The circuitry comprises a voltage controlled oscillator having an input and an output, comparing means for comparing frequency and phase of a reference signal with a signal from the output of the voltage controlled oscillator, enable/disable signal means for generating at outputs thereof non-overlapping essentially complementary enable/disable signals, a charge/discharge circuit having inputs and an output, a charge storage element having one terminal coupled to the output of the charge/discharge circuit, first gating means coupled between outputs of the comparing means and inputs of the charge/discharge circuit and having control inputs which are coupled to a first of the complementary enable/disable signals for controlling conduction paths between the comparing means and the first generating means, a loop filter having a first input and having an output coupled to the input of the voltage controlled oscillator, and second gating means coupled between the output of the charge/discharge circuit and a first input of the loop filter and having a control input which is coupled to a second of the complementary enable/disable signals for controlling a conduction path between the charge/discharge circuit and the loop filter whereby the comparing means is coupled to the charge/discharge circuit and the charge/discharge circuit is electrically isolated from the loop filter or the comparing means is electrically isolated from the charge/discharge circuit and the charge/discharge circuit is coupled to the loop filter. The comparing means is adapted to generate output signals having a duration corresponding to the phase difference between the reference signal and an output signal of the voltage controlled oscillator.

In accordance with the present invention, a PLL circuit comprises: a digital reference frequency input terminal for receiving a reference frequency signal; a voltage controlled oscillator (VCO); a digital divider for converting the output of the VCO to approximately the frequency of the reference signal; a digital phase detector for generating source and sink output signals which define the magnitudes and directions of differences in phase between the reference frequency signal and the output of the digital divider; a capacitor; a clock signal source responsive to the reference frequency signal for generating first and second non-overlapping clock signals synchronized to the reference frequency signal; a charge pump under control of the source and sink signals and the second clock signals for selectively charging and discharging the capacitor during the period of the second clock signal; a loop filter for generating VCO control voltage signals in accordance with the voltage on the capacitor; and a switching transmission gate controlled by the first clock signals for coupling the voltage on the capacitor to the input of the loop filter during the period of the first clock signal.

In accordance with an aspect of this invention, the loop filter comprises an amplifier and an AC feedback circuit which includes a switched capacitor controlled by the second clock signal. Since the first and second clock signals are synchronized to the frequency of the reference signal, the gain and bandwidth of the loop filter advantageously adapt to the frequency of the reference signal frequency.

Clocking of a portion of the AC feedback circuit of the loop filter at the reference frequency allows partial loop gain adjustment. The loop filter becomes an adaptive filter changing its gain and bandwidth whenever the reference frequency changes. This assures a partial tracking of the loop bandwidth with reference frequency which in turn results in improved capture and lock range at each reference frequency.

In accordance with a further aspect of this invention, when a PLL is in phase lock, a digital pulse injection circuit provides a fixed length increase frequency dither pulse during each reference frequency cycle to maintain activity on the loop. During the control frame in which phase lock is achieved, there are no significant increase or decrease frequency signals. The dither signal in that frame maintains activity on the loop, slightly increases VCO frequency to a value within phase lock. During each successive control frame in which phase lock is maintained, equal and opposite decrease frequency and increase frequency signals are generated essentially simultaneously to maintain loop activity.

The above sequence creates a phase detector/loop filter which operates in a sample and hold mode. The loop transients which are created by slight mismatches in the timing of the injected pulse and the correction pulse are isolated from the output during a critical operating time interval. In a practical embodiment the loop may also comprise a lead-lag network to scale the response (i.e., to trim loop gain). This scaling in turn allows construction of all critical loop components on silicon using conventional switched capacitor techniques. Thus a combination of conventional analog techniques, switched capacitors and the introduction of appropriate scaling produces an embodiment of a PLL circuit with advantageous performance.

The invention will be better understood from the following more detailed description taken with the accompanying drawings and claims.

BRIEF DESCRIPTION OF THE DRAWINGS

FIG. 1 snows in schematic and block diagram a portion of a radio receiver including a Phase Locked Loop (PLL) circuit in accordance with the present invention;

FIG. 2 in schematic and block diagram shows an embodiment of the digital pulse injection circuit of FIG. 1;

FIGS. 3 and 4 graphically show voltage waveforms versus time which are associated with the PLL circuit of FIG. 1 under various operating conditions thereof.

DETAILED DESCRIPTION

Figure 5:
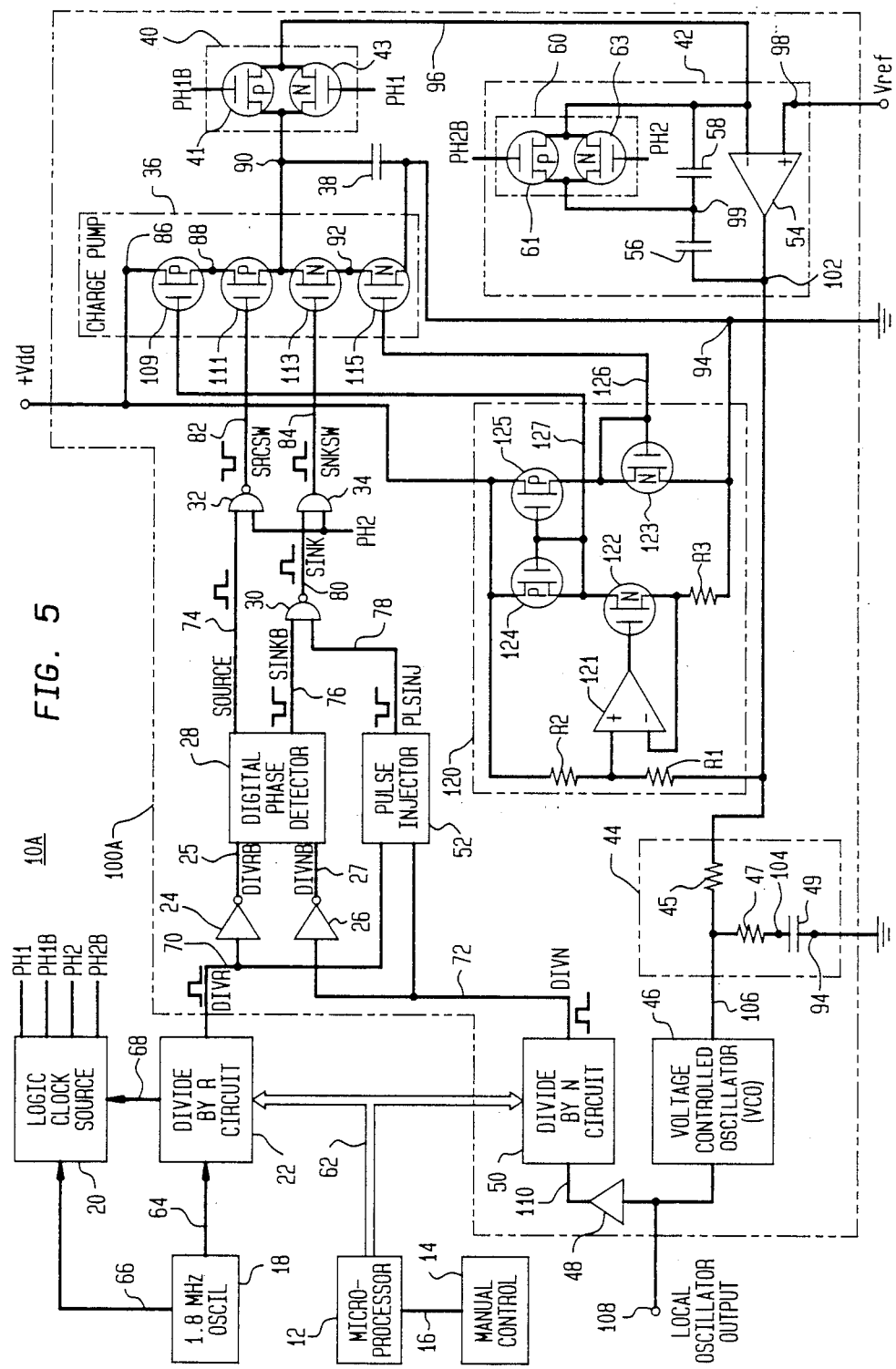
FIG. 5 shows in schematic and block diagram a portion of a radio receiver including another PLL circuit in accordance with the present invention.

Referring to FIG. 1, there is shown a portion of a radio receiver 10 which comprises a Phase Locked Loop (PLL) circuit 100 (shown within a dashed line box) in accordance with the present invention. Radio receiver 10 also comprises a microprocessor 12, a manual control 14 having an output coupled to an input of the microprocessor 12 via a conductor 16, a 1.8 MHz oscillator 18 (shown as 1.8 MHz Oscil), a logic clock source 20 and a divide by R circuit 22. PLL circuit 100 comprises inverter circuits 24 and 26, a digital phase detector 28, NAND gates 30 and 32, an AND gate 34, a charge pump 36, a capacitor 38, a first transmission gate 40 (shown within a dashed line rectangle) comprising a p-channel field effect transistor (FET) 41 and an n-channel FET 43, a loop filter 42 (shown within a dashed line rectangle), a lead-lag filter 44 (shown within a dashed line rectangle), a divide by N circuit 50, an amplifier 48, a voltage controlled oscillator (VCO) 46 and a pulse injector 52. Charge pump 36 comprises p-channel (FETs) 109 and 111 and n-channel FETs 113 and 115. Loop filter 42 comprises a high gain operational amplifier 54 having positive and negative inputs and an output, capacitors 56 and 58 and a second transmission gate 60 (shown within a dashed line rectangle) which comprises a p-channel FET 61 and an n-channel FET 63. VCO 46 comprises an inductor, a varactor (a voltage controlled diode whose capacitance changes with applied reverse voltage) and an amplifier (all of which are not shown). Lead-lag filter 44 comprises resistors 45 and 47 and a capacitor 49 and is a passive filter which serves to shunt noise to ground. Logic clock source 20 generates output signals at outputs PH1, PH1B, PH2 and PH2B. The signals generated at PH1 and PH1B are complements of each other as are the signals generated at PH2 and PH2B. PH1 and PH2 are non-overlapping signals which are otherwise complements of each other. PH1 and PH1B are coupled to the gates of FET 43 and 41, respectively. PH2 is coupled to first inputs of NAND gate 32 and AND gate 34 and to the gate of transistor 63. PH2B is coupled to the gate of FET 61. In an illustrative embodiment the FETs are metal-oxide-semiconductor field effect transistors (MOSFETs).

Digital phase detector 28 may be denoted as a means for comparing frequency and phase or as comparing means. Capacitor 38 may be denoted as a charge storage element. Charge pump 36 may be denoted as a charge/discharge circuit. NAND gate 32 and AND gate 34 may be denoted as first gating means. Transmission gate 40 may be denoted as second gating means. Logic clock source 20 may be denoted as enable/disable signal means.

Manual control 14, which is a manual interface with a person controlling the radio receiver 10, permits a selection of a particular listening band, e.g., AM or FM, a particular station of the band selected, volume and tone control of the station selection, scan and seek functions, etc. Microprocessor 12 interprets control signals received from manual control 14 and generates address and data signals on an output coupled to a data bus 62 which is coupled to inputs of divide by R and N circuits 22 and 50. Eight bits from microprocessor 12 are coupled to the divide by R circuit 22 and 14 bits are coupled to the divide by N circuit 50.

A first output of the 1.8 MHz OSCIL 18 is coupled via a conductor 64 to an input of divide by R circuit 22. A second output of the 1.8 MHz Oscil 18 is coupled via a conductor 66 to an input of logic clock source 20. A first output of divide by R circuit 22 is coupled via a conductor 68 to a second input of logic clock source 20. A second output of divide by R circuit 22 is coupled via a conductor 70 to an input of inverter 24 and to a first input of pulse injector 52. An output of divide by N circuit 50 is coupled via a conductor 72 to an input of inverter 26 and to a second input of pulse injector 52. Outputs of inverters 24 and 26 are coupled via conductors 25 and 27 to first and second inputs, respectively, of digital phase detector 28. A source signal output (shown as SOURCE) of digital phase detector 28 is coupled via a conductor 74 to a second input of NAND gate 32. A sink signal output (shown as SINKB) of the digital phase detector 28 is coupled via a conductor 76 to a first input of NAND gate 30. An output of pulse injector 52 is coupled to a second input of the NAND gate 30 via a conductor 78. An output (shown as SINK) of NAND gate 30 is coupled via a conductor 80 to a second input of AND gate 34. An output of NAND gate 32 (shown as SRCSW) is coupled via a conductor 82 to the gate of transistor 111. An output from AND gate 34 (shown as SNKSW) is coupled via a conductor 84 to the gate of transistor 113.

The source of FET 109 is coupled to a terminal 86 and to a positive voltage source +Vdd. The gate of FET 109 is coupled to a first voltage source VB1 which keeps FET 109 always biased on (enabled). The gate of FET 115 is coupled to a second fixed voltage source VB2 which keeps FET 115 always biased on (enabled). The drain of FET 109 and the source of FET 111 are coupled to a terminal 88. The drains of FETs 111 and 113 are coupled to a first terminal of the capacitor 38, to the drain of transistor 43, to the source of transistor 41 and to a terminal 90. The source of FET 113 is coupled to the drain of FET 115 and to a terminal 92. The source of FET 115 is coupled to a second terminal of capacitor 38, to a terminal 94 and to a first reference voltage which is shown as ground (zero volts). The drain of transistor 41 and the source of transistor 43 are coupled via a conductor 96 to the negative input of operational amplifier 54, to a first terminal of capacitor 58, to the source of transistor 61 and to the drain of transistor 63. The positive input of operational amplifier 54 is coupled to a second reference voltage (shown as Vref) and to a terminal 98. In an illustrative embodiment +Vdd and Vref are +10 volts and. +5 volts, respectively.

The drain of transistor 61 and the source of transistor 63 are coupled to a second terminal of capacitor 58, to a first terminal of capacitor 56 and to a terminal 99. A second terminal of capacitor 56 is coupled to an output of operational amplifier 54, to a first terminal of resistor 45 and to a terminal 102. A second terminal of resistor 45 is coupled to a first terminal of resistor 47 and to an input of VCO 46 via a conductor 106. A second terminal of resistor 47 is coupled to a first terminal of capacitor 49 and to a terminal 104. A second terminal of capacitor 49 is coupled to terminal 94 and to ground. An output of VCO 46 is couple to a local oscillator output terminal 108 of PLL circuit 100 and to an input of amplifier 48. An output of amplifier 48 is coupled to an input of divide by N circuit 50 via a conductor 110.

Amplifier 50 is a high gain limiting amplifier. In an illustrative embodiment the signal appearing at output terminal 108 is a sine wave having a peak to peak voltage of 100 mv. Amplifier 48 amplifies the input sine wave from VCO 46 and generates therefrom, at the output thereof, a five volt peak to peak square wave having the same frequency as the sine wave.

Microprocessor 12 tunes PLL circuit 100 to the desired local oscillator frequency by setting the appropriate value for N in a control register (not shown) of divide by N circuit 50. The microprocessor 12 generates on bus 62 address signals to select divide by N circuit 50 and generates data signals to set the value N in the control register (not shown) of divide by N circuit 50. For example, in the case of a 50 kHz internal reference signal and a 100 MHz local oscillator signal, the value N is set to 2,000.

IN PLL circuit 100, voltage controlled oscillator (VCO) 46 generates "local oscillator" signals on output terminal 108. In an illustrative embodiment of FIG. 1, VCO 46 comprises an inductor, a varactor as a tuning element, and an amplifier (all of which are not shown). A varactor is a voltage controlled diode which changes capacitance with applied reverse voltage. Because of their low phase/frequency noise, inductor/varactor oscillators, such as VCO 46, are well suited for use in a PLL circuit 100.

Transistors 109 and 115, in accordance with the respective physical sizes and their gate potentials, establish the amount of current sourced from +Vdd through FETs 109 and 111 to terminal 90 and to establish the amount of current sinked (pulled) from terminal 90 through FETs 113 and 115 to ground.

Transistors 111 and 113 are switching transistors which are biased off except for the duration of ground level voltage pulses (shown as SRCSW) on conductor 82 and the +10 volt level sink pulses (shown as SWKSW) on conductor 84. A negative going pulse on conductor 82 switches transistor 111 fully on and charge is added to capacitor 38 to decrease the output frequency of the VCO 46. A positive going pulse on sink conductor 84 switches transistor 113 fully on and charge is removed from capacitor 38 to increase the VCO 46 operating frequency.

Divide by R circuit 22, on the basis of data on bus 62 provides a digital internal reference frequency signal (shown as DIVR) on conductor 70. The frequency of the digital reference signal on conductor 70 is a matter of design choice. A single reference frequency e.g., 50 kHz may be used for both FM and AM reception; or signals of different frequency may be used in AM and FM reception. For example a reference signal of 25 kHz may be used in AM reception and a 100 kHz reference signal used in the case of FM reception. In the case of a 50 kHz internal reference frequency signal, the divide by R circuit 22 is set to divide the 1.8 MHz signal by 36. The pulse width of such a DIVR pulse is 555 nanoseconds.

PLL circuit 100 adjusts the control signal at the input of the VCO 46 to bring the output terminal 108 of the VCO 46 to the desired local oscillator frequency. This brings the frequency of the output (shown as DIVN) of the divide by N circuit 50 to the frequency and phase of the internal reference signal on conductor 70. Digital phase detector 28 compares the phase of the DIVRB signal (the logical inverse of DIVR) at the output of inverter 24 and the phase of the DIVNB signal (the logical inverse of DIVN) at the output of inverter 26. The DIVNB signal is a negative going pulse having a duration of about 150 nano-seconds (ns). The DIVRB signal is a negative going signal having a duration of approximately 555 ns which is the period of one cycle of the 1.8 MHz signal.

The digital phase detector 28 generates at first and second outputs "source" (shown as SOURCE) and "sinkbar" (shown as SINKB) signals which, respectively, serve to decrease VCO 46 frequency and increase VCO 46 frequency. The time duration of each output pulse is determined by the magnitude of the measured phase difference between DIVRB and DIVNB. Although the measured phase difference may exceed several hundred nano seconds, source and sinkbar signals in excess of 277 ns are reduced to about 277 ns by the action of NAND gate 32 and AND gate 34 under control of PH2. Source and sinkbar signals are limited in duration so as to allow charge pump 36 to operate only when transmission gate 40 is off. This prevents charge pump 36 noise from entering the negative input of the opamp 54. This significantly reduces noise and improves the dynamic behavior of PLL circuit 100.

If the measured phase difference results in a source or sinkbar pulse which is less than 277 ns long, a signal of the full measured phase difference signal is gated through NAND gate 32 or AND gate 34. Due to the timing of NAND gate 32 and AND gate 34 and transmission gate 40, these source and sinkbar pulses also occur only when transmission gate 40 is off.

As the desired local oscillator frequency is approached, the frequency of output signals of the divide by N circuit 50 approaches the internal reference frequency at the output of divide by R circuit 22. When there is little or no phase difference between the divide by N circuit 50 output signal DIVN and the divide by R circuit 22 output reference frequency signal DIVR, the PLL circuit 100 is "locked" to the reference frequency. The digital phase detector 28 must detect at least a minimum threshold phase difference before a significant source signal or a significant sinkbar signal is generated. A significant signal is a signal of sufficient duration (e.g., 60 ns) to keep the PLL circuit 100 active. In the absence of significant signals, there is an effective "open loop" or "dead band" condition on the PLL circuit 100. In prior art PLL circuits, if the "open loop" condition remains for many reference frequency cycles, the PLL circuits can potentially become unstable and will generate unpredictable FM noise. As will become clear from the below discussion, PLL circuit 100 does not suffer this problem.

In the prior art, stray and explicit leakage paths have been used to maintain activity on the loop. However, in accordance with the present invention, extensive circuit integration almost completely eliminates stray leakage paths and an "open loop" condition may continue for many frames during phase lock. Accordingly, loop gain may change in an unpredictable manner; and PLL circuit 100 performance may degrade or become unstable. As will be explained herein below, pulse injector 52 prevents an "open loop" or "dead band" condition and therefore contributes to PLL circuit 100 performing in a predictable and stable manner.

In accordance with an aspect of this invention, the loop filter 42 comprises an AC feedback circuit which includes capacitors 56 and 58 and transmission gate 60 which is controlled by the clock signals appearing at the outputs PH2 and PH2B of logic clock source 20. Since these clock signals are synchronized to the frequency of the reference signal generated by divide by R circuit 22, the gain and bandwidth of the loop filter 42 advantageously adapts to the frequency of the reference signal frequency.

Clocking of a portion of the AC feedback circuit of the loop filter 42 at the reference frequency allows partial loop gain adjustment The loop filter 42 becomes an adaptive filter changing its gain and bandwidth whenever the reference frequency changes. This assures a partial tracking of the loop bandwidth with reference frequency which in turn results in improving capture and lock range at each reference frequency.

In accordance with an aspect of the present invention, in a first frame (time period - see for example frame 4 of FIG. 4) in which phase lock is attained, pulse injector 52 generates a "PLSINJ" signal to maintain loop activity. The "PLSINJ" signal is in an illustrative sample a 60 ns negative going pulse which occurs on conductor 78. As will be explained more fully later herein, the PLSINJ pulse causes a small increase in the VCO 46 frequency within the range of PLL circuit 100 lock. In succeeding frames (for example, see frame 5 of FIG. 4), for the duration of PLL circuit 100 lock, digital phase detector 28 generates a source pulse of about 60 ns duration on conductor 74 to compensate for the PLSINJ pulse in the first "lock" frame; and at essentially the same time in each succeeding frame during lock, pulse injector 52 generates a 60 ns PLSINJ pulse which, in effect, corresponds to a sink pulse. The net effect of the simultaneous compensating source pulse and sink pulses is to maintain the small phase offset which was caused by the first PLSINJ pulse. Thus PLL circuit 100 operates at a small phase offset and is always active. Hence, the "dead band" condition is avoided.

Referring now to FIG. 2, there is shown a pulse injector 200 within a dashed line rectangle in accordance with the invention. The structure of pulse injector 200 can be used as the pulse injector 52 of FIG. 1 and comprises NAND gates 202 and 204, delay element 206 and inverter 212. Conductors 70 and 72 of FIG. 1 are shown coupled to two inputs of NAND gate 204 and conductor 78 of FIG. 1 is shown coupled to an output of NAND gate 202.

An output of NAND gate 204 is coupled to a first input of NAND gate 202, to one terminal of delay element 206 and to a terminal 205. A second terminal of delay element 206 is coupled to an input of inverter 212 and to a terminal 207. An output of inverter 212 is coupled to a second input of NAND gate 202 and to a terminal 209.

Pulse injector 52 of FIG. 1 is a "one shot" circuit which is primed to generate an output pulse when a DIVR pulse and a DIVN pulse occur at the same time on conductors 70 and 72. Since DIVR and DIVN pulses are both positive going pulses, NAND gate 204 provides a low output signal to the input of delay circuit 206 and to one input of NAND gate 202. The delayed low signal at the output of delay element 206 is inverted by inverter 212 to provide a high input signal to the second (upper) input terminal of NAND gate 202. With one high input signal and one low input signal, the output of NAND gate 202 is high. At such time as either the DIVR or the DIVN signal goes low, the output of NAND gate 204 goes high and the firs (lower) input of NAND gate 202 goes high. The upper input to NAND gate 202 remains high for 60 ns after either DIVN or DIVR goes low. Accordingly, the output of NAND gate 202 goes low for 60 ns to generate a PLSINJ pulse.

As is shown in FIG. 1, sinkbar pulses on conductor 76 and PLSINJ pulses on conductor 78 are both negative going pulses. Accordingly, except for the duration of a sink pulse or a pulse injection pulse, the output of NAND gate 30 is low. For the duration of a sinkbar pulse or of a PLSINJ pulse, the sink signal at the output of NAND gate 30 goes high.

The purpose of charge pump 36 is to selectively charge and discharge capacitor 38. In the illustrative embodiment of FIG. 1, capacitor 38 is in the order of 3 pico farads.

SRCSW on conductor 82 is connected to the gate of switching transistor 111 and SNKSW conductor 84 is connected to the gate of transistor 113. Transistors 111 and 113 are switching transistors which are fully off except for the duration of the SRCSW and SNKSW pulses on conductors 82 and 84. A negative going pulse on SRCSW conductor 82 switches transistor 111 fully on and charge is added to capacitor 38 to decrease the VCO 46 frequency. A positive going pulse on SNKSW conductor 84 switches transistor 113 fully on and charge is removed from capacitor 38 to increase the VCO 46 operating frequency. For a long SRCSW pulse (e.g., a pulse of 277 ns) the capacitor 38 is charged to a value near +VDD, (typically +10 volts). For a similarly long SNKSW pulse, capacitor 38 is discharged to near ground potential.

It is important to note that because all control input signals to charge pump 36 are generated during PH2, the voltage on capacitor 38 is settled before the beginning of PH1 which controls transmission gate 40 to transfer the voltage on capacitor 38 to the inverting input of opamp 54 of loop filter 42. This effectively prevents noise generated by the charge pump 36 from entering the inverting input of the opamp 54. This significantly reduces noise in PLL circuit 100.

An AC feedback circuit comprising the capacitors 56 and 58 and transmission gate 60 from the output of opamp 54 to its inverting input terminal adapts to the PLL circuit 100 internal reference frequency since transmission gate 60 is clocked by PH2 and PH2B clock signals. In the illustrative embodiment, the internal reference frequency is 50 kHz; however, if a 25 kHz or 100 kHz reference frequency is employed, the gain and bandwidth of the loop filter 42 adapts to the current reference frequency. Since transmission gate 60 is operated by PH2 and PH2B signals, all switching activity in the feedback circuit is completed prior to the beginning of PH1 which transfers the voltage on capacitor 38 to the inverting input of opamp 54. The non-inverting terminal of opamp 54 is connected to a mid-supply +5 volt reference potential source. The inverting input terminal of opamp 54 is at virtual ground (i.e., the mid-supply +5 volt reference value connected to the non-inverting input terminal).

When transmission gate 40 is turned on by PH1 and PH1B clock signals, the voltage on capacitor 38 is transferred to the input of opamp 54. If the voltage on capacitor 38 is less than virtual ground (+5 volts), the output voltage of opamp 54 increases to increase the control (input) voltage for the VCO 46 to increase the VCO 46 operating frequency. If the voltage on capacitor 38 is greater than virtual ground (+5 volts), the output voltage of opamp 54 decreases to decrease the control (input) voltage for the VCO 46 to decrease the VCO 46 operating frequency. The output of the loop filter 42 is a voltage signal which varies from about 0.5 to about 10 volts to tune the VCO 46 across the desired band of frequencies (e.g., from 82 to 122 MHz).

In summary, it is important to note that capacitor 38 is selectively charged/discharged during PH2. Since transmission gate 40 is turned on by PH1 clock signals, the charge on the capacitor 38 has fully settled and the charge pump 36 activity is completed prior to PH1 which couples the voltage on capacitor 38 (i.e., the voltage of terminal 90) to the input of opamp 54. This effectively prevents noise generated by the charge pump 36 from entering the inverting input of opamp 54. This significantly reduces noise in PLL circuit 100.

With the preceding background, the control signals of frames 1 through 6 of FIGS. 3 and 4 are more readily understood.

FIGS. 3 and 4 show six frames of PLL circuit 100 control activity for various time relations of DIVNB and DIVRB pulses. Logic timing signals, namely, 1.8 MHz., DIVR, PH1, and PH2 are shown at the top of FIGS. 3 and 4. For each of frames one through six, FIGS. 3 and 4 show the relations of the following signals: DIVRB, DIVNB, SOURCE, SINK, PLSINJ, SRCSW, and SNKSW.

The following discussion of the events in frames 1 through 6 demonstrates the nature of the signals that control charge pump 36 and thus the input (control) voltage for the VCO 46.

In frame 1, DIVNB leads DIVRB by a significant amount, and there is no overlap in time between the occurrences of the two pulses. The phase difference of the two pulses is measured from the rising edge of the first of the two pulses to occur to the rising edge of the second of the two pulses. In frame 1, since DIVNB leads DIVRB, a source pulse is generated on conductor 74 to initiate a decrease in the VCO 46 frequency. The beginning of the source pulse in frame 1 starts slightly after the trailing edge of DIVNB and terminates slightly after the trailing edge of DIVRB.

As seen in FIG. 1, PH2 clock pulses control NAND gate 32 and AND gate 34. The output signals of AND gate 32 and of NAND gate 34 are termed "source switched" (SRCSW) and "sink switched" (SNKSW) signals, respectively. In FIG. 1, a SRCSW signal is a negative going digital input signal to charge pump 36; and a SNKSW signal is a positive going digital input signal to charge pump 36.

In FIG. 1, the SRCSW signal begins slightly after the leading edge of PH2 and terminates slightly after the trailing edge of DIVRB. The period of SRCSW is in the order of 277 ns.

Returning now to FIG. 3, in frame 2, PLL circuit 100 is not in lock; DIVNB leads DIVRB with overlap in time between the two signals; however DIVNB terminates before the beginning of the PH2 clock signal. As in frame 1, because the source signal begins before the leading edge of PH2, the SRCSW signal is a maximum 277 ns signal which is of shorter time duration than the source signal.

As explained earlier herein, when there is time overlap between DIVN and DIVR, a 60 ns PLSINJ pulse injection pulse is generated. The PLSINJ pulse begins when either DIVN or DIVR terminates and has a 60 ns duration. In frame 2, PLSINJ terminates before PH2; therefore, PLSINJ is not propagated to SNKSW.

In frame 3, PLL circuit 100 is not in lock; DIVN leads DIVRB with overlap in time between the two signals; and there is time overlap between DIVNB and PH2 clock signal. Under these circumstances the SRCSW signal is of the same time duration as source and PLSINJ is propagated through NAND gate 30 and AND gate 34 to appear on conductor 84 as SNKSW.

Referring now to FIG. 4, the first occurrence of phase lock is illustrated in frame 4. The trailing edges of DIVNB and DIVRB occur at essentially the same time; there is no source or sinkbar signal; and a PLSINJ signal appears on SNKSW. In the absence of the digital PLSINJ signal, there would be an effective open loop condition in the PLL circuit 100. The PLSINJ signal in the frame of first occurrence of phase lock maintains activity on the loop and causes a small increase in the VCO 46 frequency without driving the PLL circuit 100 out of lock. The increase in frequency is countered in the next succeeding frame 5.

Frame 5 is representative of frames which follow the first frame in which lock is achieved and in which lock still exists. In frame 5, DIVNB slightly leads DIVRB because of the PLSINJ pulse in the first "lock" frame; and a PLSINJ pulse occurs because there is overlap in time between DIVN, DIVR, and PH2. Equal SRCSW and SINKSW signals maintain current on the loop; however, the slight phase offset caused by the PLSINJ pulse in the first lock frame is maintained.

In frame 6, DIVNB trails DIVRB; there is no overlap in time between DIVNB and DIVRB; accordingly, there is no pulse injection pulse. However the phase difference between DIVNB and DIVRB is less than 277 ns. Accordingly, SNKSW is of the same time duration as SINK. If DIVNB trails DIVRB by more than 277 ns, the resulting longer SINK signal is limited to a 277 ns SNKSW signal by PH2's control of NAND gate 32 and AND gate 34.

Referring now to FIG. 5, there is shown a portion of a radio receiver 10A which comprises a preferred embodiment of a Phase Locked Loop circuit 100A (shown within a dashed line box) in accordance with the present invention. Receiver 10A is essentially identical to receiver 10 of FIG. 1 except that Phase Locked Loop circuit 100A comprises a compensation circuit 120 which is disclosed in a pending patent application Ser. No. 402,042 entitled "Compensated Phase Locked Loop Circuit", filed on Sept. 1, 1989 and in which two of the present inventors are inventors and in which there is a common assignee. This previously filed patent application is incorporated by reference herein. Compensation circuit 120 comprises p-channel FETs 124 and 125, n-channel FETs 122 and 123, operational amplifier (opamp) 121 and resistors R1, R2 and R3. A first terminal of resistor R1 is coupled to the terminal 102. A second terminal of resistor R1 is coupled to a first terminal of resistor R2 and to a positive input of opamp 121. A second terminal of resistor R2 is coupled to the sources of FETs 124 and 125, to the terminal 86 and to +Vdd. A negative input of opamp 121 is coupled to the source of FET 122 and to a first terminal of resistor R3. A second terminal of resistor R3 is coupled to the source of FET 123, to the terminal 94 and to ground. The drains of FETs 122 and 124 and the gates of FETs 124 and 125 are coupled via a conductor 127 to the gate of transistor 109 of charge pump 36. The drains of FETs 123 and 125 and the gate of FET 123 are coupled via a conductor 126 to the gate of FET 115 of charge pump 36. Thus PLL circuit 100A differs from PLL circuit 100 of FIG. 1 in that it comprises compensation circuit 120 and in that the gates of FETs 109 and 115 are coupled to outputs of compensation circuit 120 and not to VB1 and VB2, respectively.

Typically VCO 46 comprises a varactor (not shown). Varactor voltage sensitivity, i e., the change in capacitance of a varactor for equal incremental changes in applied voltage, varies in a non-linear fashion as a function of the voltage applied at the time the incremental change is made. The voltage sensitivity of a varactor is much higher for low values of applied voltage which correspond to high values of capacitance and low values of oscillator frequency than for high values of applied voltage which correspond to low values of capacitance and high values of oscillator operating frequency.

Compensation circuit 120 provides a feedback path which modifies the operation of charge pump 36 so as introduce the complement of any non-linearity introduced by VCO 46. This feedback improves the predictability of loop performance of PLL circuit 100A.

PLL circuit 100A can be fabricated on a single integrated circuit silicon chip using CMOS technology. In some applications lead-lag filter 44 is not formed on the chip but is formed from individual components because of the high values of components.

It is to be understood that the specific embodiments described herein are intended merely to be illustrative of the spirit and scope of the invention. Modifications can readily by made by those skilled in the art consistent with the principles of this invention. For example, other electrical configurations can be substituted for the charge pump 36, transmission gates 40 and 60, loop filter 42 and pulse injector 200 so long as they perform the same functions. Still further, resistor 45 can be a variable resistor. The resistance selected for resistor 45 affects the loop gain of the PLL circuits 100 and 100A. The value of the resistance of resistance 45 is selected to optimize loop gain of PLL circuits 100 and 100A. Furthermore, the combination of loop filter 42 and resistor 45 could be replaced by an equivalent circuit which would provide variable current on conductor 106. Still further, PLL circuits 100 and 100A can be fabricated in other than CMOS technologies such as in n-channel, BMOS or gallium arsenic technology.

The embodiments of the invention in which an exclusive property or privilege is claimed are defined as follows:

1. Circuitry comprising:
   a voltage controlled oscillator having an input and an output;
   comparing means for comparing frequency and phase of a reference signal with a signal from the output of the voltage controlled oscillator, said comparing means being adapted to generate output signals having a duration corresponding to the phase difference between the reference signal and an output signal of the voltage controlled oscillator;
   enable/disable signal means for generating at outputs thereof non-overlapping essentially complementary enable/disable signals;
   a charge/discharge circuit having inputs and an output;
   a charge storage element having one terminal coupled to the output of the charge/discharge circuit;
   first gating means coupled between outputs of the comparing means and inputs of the charge/discharge circuit and having control inputs which are coupled to a first of the complementary enable/disable signals for controlling conduction between the comparing means and the charge/discharge circuit;
   a loop filter having a first input and having an output coupled to the input of the voltage controlled oscillator: and
   second gating means coupled between the output of the charge/discharge circuit and the first input of the loop filter and having a control input which is coupled to a second of the complementary enable/disable signals for controlling a conduction path between the charge discharge circuit and the loop filter whereby the comparing means is coupled to the charge/discharge circuit and the charge/discharge circuit is electrically isolated from the loop filter or the comparing means is electrically isolated from the charge/discharge circuit and the charge/discharge circuit is coupled to the loop filter.

2. The circuitry of claim 1 wherein
the loop filter comprises an amplifier having an inverting input and an output, first and second capacitors and third gating means;
the inverting input of the amplifier is coupled to the output of the second gating means and to a first terminal of the first capacitor and to a first input/output terminal of the third gating means;
a second terminal of the first capacitor being coupled to a first terminal of the second capacitor;
a second terminal of the second capacitor being coupled to the output of the amplifier and to the input of the voltage controlled oscillator; and
a control terminal of the third gating means being coupled to the first of the complementary enable/disable signals such that the first and second terminals of the first capacitor are essentially coupled together when the third gating means is enabled by the first of the complementary enable/disable signals.

3. The circuitry of claim 2 further comprising a lead-lag filter having an input coupled to the output of the amplifier and having an output coupled to the input of the voltage controlled oscillator.

4. The circuitry of claim 3 further comprising a divide by N circuit having an input coupled to the output of the voltage controlled oscillator and having an output coupled to an input of the comparing means.

5. The circuitry of claim 4 wherein the comparing means is a digital phase detector.

6. The circuitry of claim 5 wherein the charge storage element is a third capacitor.

7. The circuitry of claim 6 wherein the first gating means comprises a NAND gate and an AND gate and the second gating means comprises a first transmission gate.

8. The circuitry of claim 7 wherein the charge/discharge circuit comprises the series combination of two p-channel field effect transistors and two n-channel field effect transistors.

9. The circuitry of claim 8 wherein the third gating means comprises a second transmission gate.

10. The circuitry of claim 9 wherein the first and second transmission gates each comprise a complementary pair of field effect transistors.

11. The circuitry of claim 10 wherein all of the transistors are metal-oxide-semiconductor transistors.

12. The circuitry of claim 11 wherein all components thereof, except for the lead-lag filter, are formed in a silicon integrated circuit chip.

13. A phase locked loop comprising:
a reference frequency input terminal for receiving an internal reference frequency signal;
a voltage controlled oscillator;
a digital divider for converting the output signal of said voltage controlled oscillator to approximately the frequency of said reference signal;
means for controlling said digital divider;
digital phase detector means for generating increase frequency and decrease frequency control signals which define the magnitudes and directions of differences in phase between the reference frequency signal and the output of the digital divider;
a clock signal source responsive to the reference frequency signal for generating first and second non-overlapping clock signals synchronized to the reference frequency signal;
a capacitor;
charge pump means under control of said decrease frequency and increase frequency signals and said second clock signals for selectively charging and discharging said capacitor during the period of said second clock signal;
loop filter means for generating voltage controlled oscillator control voltage signals in accordance with voltages on said capacitor; and
a switching transmission gate controlled by said first clock signal for coupling the voltage on said capacitor to an input of said loop filter.

14. The phase locked loop of claim 13 wherein said loop filter means comprises AC feedback means including a switched capacitor clocked by said second clock signals.

15. Phase locked loop circuit comprising:
a reference frequency input terminal for receiving an internal reference frequency signal;
a voltage controlled oscillator (VCO) for generating oscillator output signals;
a digital divider for converting said output signals of said VCO to signals having approximately the frequency of said reference signal;
means for controlling said digital divider;
digital phase detector means for generating first increase frequency and first decrease frequency control signals which define the magnitudes and directions of differences in phase between the reference frequency signal and the output signal (DIVN) of said digital divider;
a clock signal source responsive to the reference frequency signal for generating first and second non-overlapping clock signals synchronized to the reference frequency signal;
a capacitor;
charge pump means under control of said first decrease frequency and first increase frequency signals and said second clock signals for selectively charging and discharging said capacitor during the periods of said second clock signal;
loop filter means for generating VCO control voltage signals in accordance with voltages on said capacitor; and
a switching transmission gate controlled by said first clock signals (PHI) for coupling the voltage on said capacitor to the input of said loop filter.

16. The phase locked loop circuit PLL of claim 15 wherein said loop filter means comprises AC feedback means including a switched capacitor clocked by said second clock signals 17. The phase locked loop circuit of claim 15 wherein further comprising:
digital pulse injector generating means for generating fixed length increase frequency dither signals when said phase locked loop circuit is locked;
gating means for generating second increase frequency output signals which are the logical OR of said first increase frequency control signals and said fixed length increase frequency dither signals; and wherein said charge pump means is under control of said second increase frequency output signals.

18. The phase locked loop circuit of claim 15 further comprising:
a lead-lag filter means connected between the output of said loop filter and the control input terminal of said VCO; and
said lead-lag pass filter means removes signals at the frequency of said reference frequency signal from the output signals of said loop filter.

19. The phase locked loop circuit of claim 18 wherein the phase locked loop circuit, except for said lead-lag filter, is constructed in CMOS integrated circuit technology.

20. The phase locked loop circuit of claim 15 wherein said charge pump means comprises gate means for limiting the maximum time duration of charge pump charge and discharge periods to the time duration of said second clock pulse signal.

21. The phase locked loop circuit of claim 20 wherein:
said gate means comprises first and second gate circuits;
said first gate circuit comprises: a source input terminal for receiving said first decrease frequency signals, a clock input terminal for receiving said second clock signals, a switched source output terminal, and means for generating switched source signals at said switched source output terminal which are the logical NAND of said first decrease frequency signals and said second clock signals; and
said second gate circuit comprises: a sink input terminal for receiving said second increase frequency signals, a switched, sink output terminal, and means for generating switched sink signals at said switched sink output terminal which are the logical AND of said second decrease frequency signals and said second clock signals.

* * * * *